US008785253B2

(12) United States Patent
Li

(10) Patent No.: US 8,785,253 B2
(45) Date of Patent: Jul. 22, 2014

(54) LEADFRAME FOR IC PACKAGE AND METHOD OF MANUFACTURE

(75) Inventor: Tunglok Li, Hong Kong (CN)

(73) Assignee: Kaixin, Inc., Hong Kong (CN)

( * ) Notice: Subject to any disclaimer, the term of this patent is extended or adjusted under 35 U.S.C. 154(b) by 98 days.

(21) Appl. No.: 13/262,709

(22) PCT Filed: Feb. 26, 2010

(86) PCT No.: PCT/CN2010/000239
§ 371 (c)(1),
(2), (4) Date: Oct. 20, 2011

(87) PCT Pub. No.: WO2010/111885
PCT Pub. Date: Oct. 7, 2010

(65) Prior Publication Data
US 2012/0025357 A1 Feb. 2, 2012

Related U.S. Application Data

(60) Provisional application No. 61/166,547, filed on Apr. 3, 2009, provisional application No. 61/226,361, filed on Jul. 17, 2009.

(51) Int. Cl.
*H01L 21/00* (2006.01)
*H01L 23/00* (2006.01)

(52) U.S. Cl.
CPC ....... *H01L 24/00* (2013.01); *H01L 2224/48091* (2013.01); *H01L 2224/48247* (2013.01); *H01L 2924/01079* (2013.01); *H01L 2924/01078* (2013.01); *H01L 2924/14* (2013.01)
USPC .......................................... 438/123; 257/666

(58) Field of Classification Search
CPC ........... H01L 2224/48091; H01L 2924/01079; H01L 2224/48247; H01L 224/01078; H01L 2924/149
USPC .......................................... 257/666; 438/123
See application file for complete search history.

(56) References Cited

U.S. PATENT DOCUMENTS

| 5,468,994 A | 11/1995 | Pendse |
| 5,661,337 A | 8/1997 | Manteghi |
| 6,084,292 A | 7/2000 | Shinohara |
| 6,191,494 B1 | 2/2001 | Ooyama et al. |
| 6,229,200 B1 | 5/2001 | Mclellan et al. |
| 6,238,952 B1 | 5/2001 | Lin |

(Continued)

FOREIGN PATENT DOCUMENTS

| CN | 1222252 | 7/1999 |
| CN | 100385641 | 2/2006 |

(Continued)

OTHER PUBLICATIONS

U.S. Appl. No. 13/287,502, Li (Continued)

*Primary Examiner* — Anthony Ho
(74) *Attorney, Agent, or Firm* — Winstead PC

(57) ABSTRACT

A leadframe for use in an integrated circuit (IC) package comprising a metal strip partially etched on a first side. In some embodiments, the leadframe may be selectively plated on the first side and/or on a second side. The leadframe may be configured for an IC chip to be mounted thereon and for a plurality of electrical contacts to be electrically coupled to the leadframe and the IC chip.

14 Claims, 9 Drawing Sheets

(56) References Cited

U.S. PATENT DOCUMENTS

| | | |
|---|---|---|
| 6,242,281 B1 | 6/2001 | Mclellan et al. |
| 6,294,100 B1 | 9/2001 | Fan et al. |
| 6,306,685 B1 | 10/2001 | Liu et al. |
| 6,319,749 B1 | 11/2001 | Shigeta et al. |
| 6,372,539 B1 | 4/2002 | Bayan et al. |
| 6,465,734 B2 | 10/2002 | Yamada et al. |
| 6,498,099 B1 | 12/2002 | McLellan et al. |
| 6,545,347 B2 | 4/2003 | McClellan |
| 6,548,328 B1 | 4/2003 | Sakamoto et al. |
| 6,585,905 B1 | 7/2003 | Fan et al. |
| 6,642,082 B2 | 11/2003 | Yamaguchi et al. |
| 6,664,615 B1 | 12/2003 | Bayan et al. |
| 6,670,222 B1 | 12/2003 | Brodsky |
| 6,700,188 B2 | 3/2004 | Lin |
| 6,777,265 B2 | 8/2004 | Islam et al. |
| 6,812,552 B2 | 11/2004 | Islam et al. |
| 6,940,154 B2 | 9/2005 | Pedron et al. |
| 6,967,125 B2 | 11/2005 | Fee et al. |
| 6,975,022 B2 | 12/2005 | Sakamoto et al. |
| 6,995,458 B1 | 2/2006 | Hashemi |
| 7,049,177 B1 | 5/2006 | Fan et al. |
| 7,049,696 B2 | 5/2006 | Kubo |
| 7,064,419 B1 | 6/2006 | Bayan et al. |
| 7,129,116 B2 | 10/2006 | Islam et al. |
| 7,173,321 B2 | 2/2007 | Kim |
| 7,176,582 B2 | 2/2007 | Kloen et al. |
| 7,186,588 B1 | 3/2007 | Bayan et al. |
| 7,217,991 B1 | 5/2007 | Davis |
| 7,247,526 B1 | 7/2007 | Fan et al. |
| 7,270,867 B1 | 9/2007 | Kwan et al. |
| 7,410,830 B1 | 8/2008 | Fan et al. |
| 7,411,289 B1 | 8/2008 | McLellan et al. |
| 7,419,855 B1 | 9/2008 | Lee et al. |
| 7,541,668 B2 | 6/2009 | Choi |
| 7,622,332 B2 | 11/2009 | Islam et al. |
| 7,671,452 B1 | 3/2010 | Bayan et al. |
| 7,749,809 B2 | 7/2010 | How et al. |
| 7,786,557 B2 | 8/2010 | Hsieh et al. |
| 7,880,282 B2 | 2/2011 | Holland |
| 7,888,179 B2 | 2/2011 | Kagaya et al. |
| 2003/0207498 A1* | 11/2003 | Islam et al. ............... 438/120 |
| 2004/0251557 A1* | 12/2004 | Kee ............... 257/777 |
| 2006/0267164 A1* | 11/2006 | Chung et al. ............... 257/668 |
| 2007/0034993 A1 | 2/2007 | Lange |
| 2007/0052076 A1 | 3/2007 | Ramos et al. |
| 2007/0085199 A1 | 4/2007 | Ong et al. |
| 2008/0258273 A1 | 10/2008 | Liang et al. |
| 2008/0258278 A1 | 10/2008 | Ramos et al. |
| 2008/0285251 A1 | 11/2008 | Liang et al. |
| 2008/0290486 A1 | 11/2008 | Chen et al. |
| 2008/0315412 A1 | 12/2008 | Liang et al. |
| 2009/0194854 A1 | 8/2009 | Tan et al. |
| 2010/0044884 A1 | 2/2010 | Zbrzezny et al. |
| 2010/0224971 A1 | 9/2010 | Li |

FOREIGN PATENT DOCUMENTS

| | | |
|---|---|---|
| CN | 1929102 | 3/2007 |
| EP | 0700086 A2 | 3/1996 |
| JP | 2001024135 A | 1/2001 |
| JP | 2005303039 A | 10/2005 |
| JP | 2005317998 A | 11/2005 |
| JP | 2006128734 | 5/2006 |
| JP | 2007048981 A | 2/2007 |
| WO | WO-03085731 A1 | 10/2003 |

OTHER PUBLICATIONS

U.S. Appl. No. 13/389,935, Li
U.S. Appl. No. 12/816,974, Tung Lok Li
Xie, Shaojun, "International Search Report" for PCT/CN2009/072030, as mailed Dec. 10, 2009, 4 pages.
Zhi, Yue, "International Search Report", for PCT/CN2009/001320 as mailed Jun. 10, 2010 (4 pages).
Li, Qinghui, "International Search Report", for PCT/CN2010/000239 as mailed Jun. 3, 2010 (3 pages).

* cited by examiner

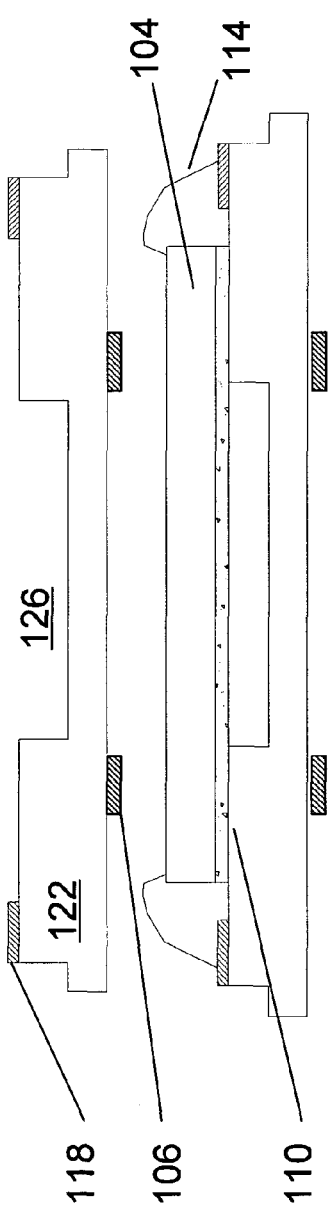
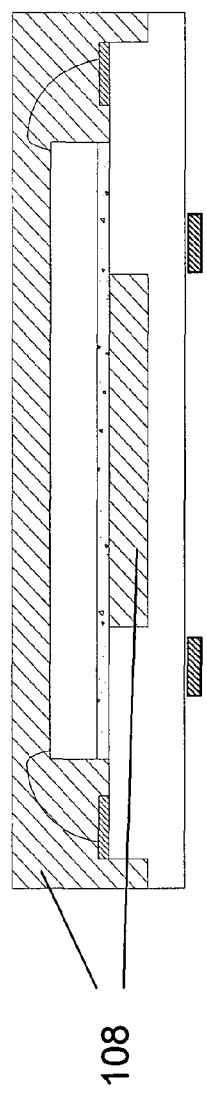
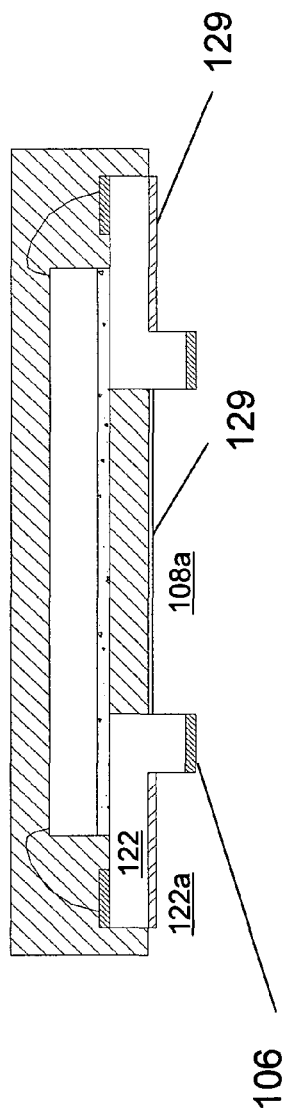
FIG. 1A
FIG. 1B
FIG. 1C
FIG. 1D
FIG. 1E

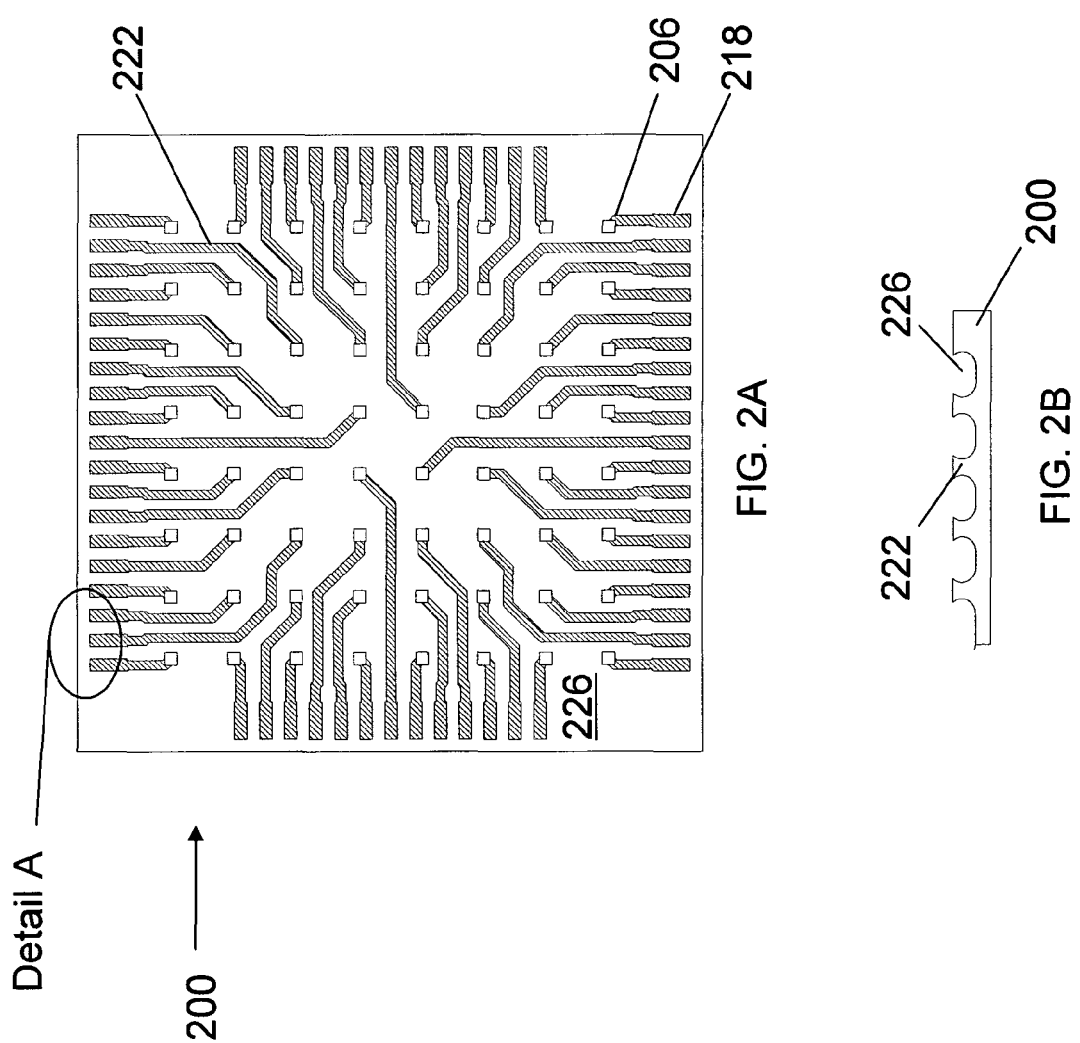

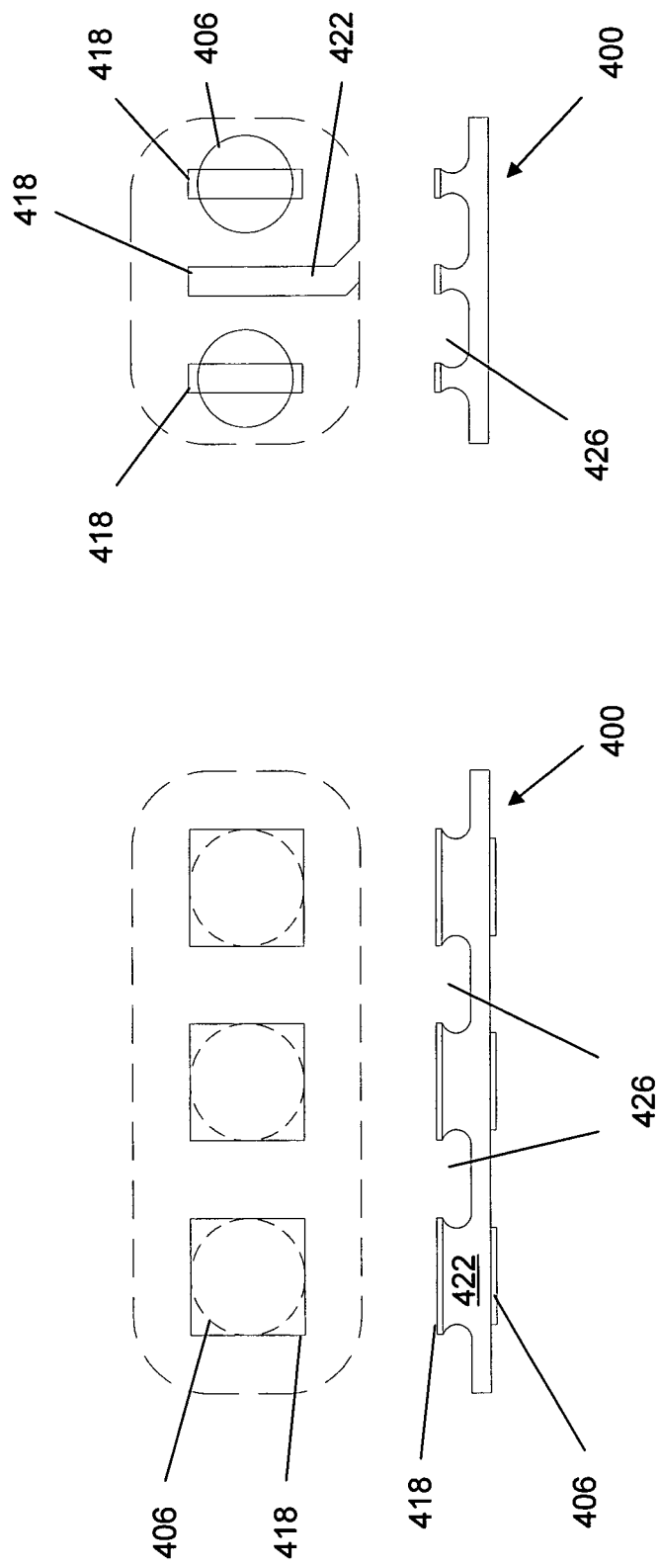

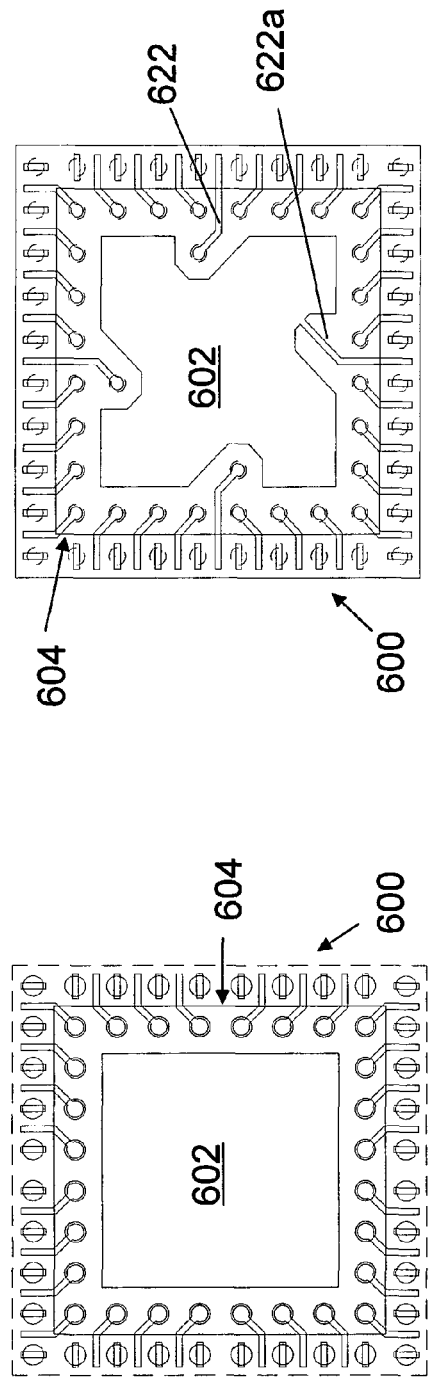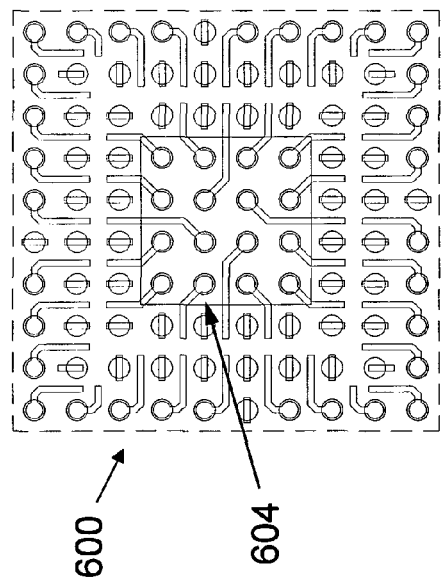

LEADFRAME FOR IC PACKAGE AND METHOD OF MANUFACTURE

CROSS-REFERENCE TO RELATED APPLICATIONS

This application claims the benefit of U.S. Provisional Application No. 61/166,547, filed Apr. 3, 2009, and Provisional Application No. 61/226,361, filed Jul. 17, 2009, which are hereby incorporated by reference.

BACKGROUND

1. Technical Field

This patent application relates generally to integrated circuit (IC) packaging technology and, in particular, but not by way of limitation, to leadframes for IC packages and methods of manufacturing thereof.

2. Background

IC packaging is one of the final stages involved in the fabrication of IC devices. During IC packaging, one or more IC chips are mounted on a package substrate, connected to electrical contacts, and then coated with an encapsulation material comprising an electrical insulator such as epoxy or silicone molding compound. The resulting IC package may then be mounted onto a printed circuit board (PCB) and/or connected to other electrical components.

Oftentimes, IC packages may include electrical contacts rather than external leads, where the electrical contacts are covered on top by the encapsulating material and are exposed on the bottom of the IC package so they can be connected to electrical components located beneath the IC package. Oftentimes, using a metal leadframe to form part of the IC package may be more cost effective than using a laminated board or tape material because, for example, more cost effective materials may be used, such as copper, nickel, or other metals or metal alloys, and use of such materials may allow more cost effective manufacturing processes to be employed, such as stamping or etching rather than multi-step laminate processes.

SUMMARY

Various embodiments disclosed in this application contemplate partially etched and selectively plated leadframes for use in integrated circuit (IC) packages having high density contacts and methods of manufacturing. The above summary of the invention is not intended to represent each embodiment or every aspect of the present invention.

BRIEF DESCRIPTION OF THE DRAWINGS

A more complete understanding of various embodiments of the present invention may be obtained by reference to the following Detailed Description when taken in conjunction with the accompanying Drawings, wherein:

FIGS. 1A-E illustrate aspects of an embodiment of a leadless IC package at various stages of a manufacturing process;

FIGS. 2A-B are two views of an embodiment of a metal leadframe having a plurality of metal traces formed on a top surface thereof;

FIGS. 4A-B illustrate various aspects of an embodiment of a partially etched and selectively plated leadframe;

FIGS. 6A-C illustrate top views of various embodiments of a partially etched leadframe for use in a leadless IC package;

DETAILED DESCRIPTION OF ILLUSTRATIVE EMBODIMENTS

Figure 3B:
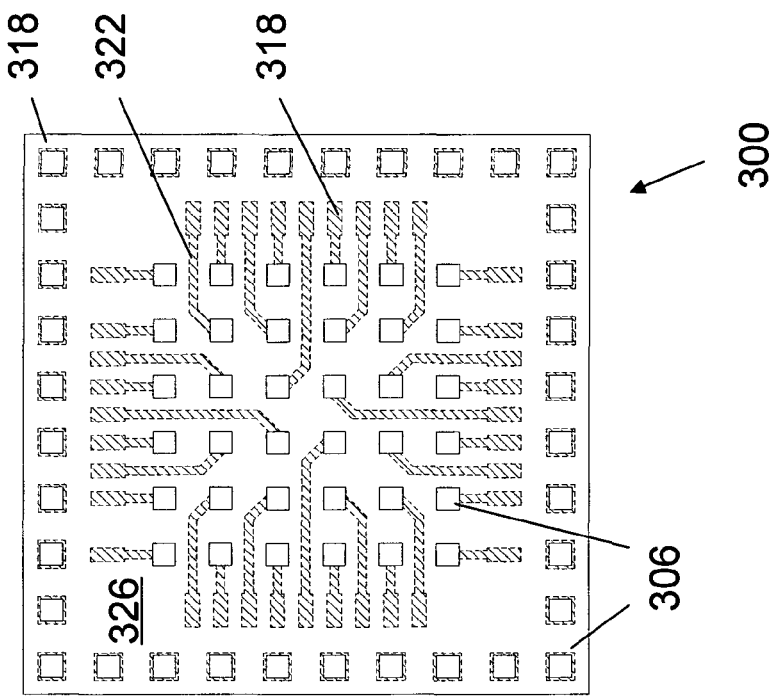
FIGS. 3A-B are a top view and a bottom view of an embodiment of a leadframe having two rows of bonding areas and multiple rows of contact areas.

Various embodiments of the present invention will now be described more fully with reference to the accompanying drawings. The invention may, however, be embodied in many different forms and should not be construed as limited to the embodiments set forth herein; rather, the embodiments are provided so that this disclosure will be thorough and complete, and will fully convey the scope of the invention to those skilled in the art.

Referring now to FIGS. 1A-E, cross-sectional side views of an embodiment of an IC package at various stages of a manufacturing process are shown. For descriptive purposes, the manufacturing process has been described relative to a single IC package, but, as will be described in more detail below, the steps of the manufacturing process may be applied to some or all of a plurality of device areas disposed on a leadframe strip. Referring now to FIG. 1A, the process begins with an unetched leadframe 100, such as a metal strip having generally flat top and bottom surfaces. Oftentimes, a manufacturer may receive design criteria for an IC package, such as, for example, the size of an IC chip to be mounted to the leadframe and the number of bonding areas to be disposed on a top surface of the leadframe. The design criteria may also include the size and location of contact areas to be disposed on a bottom surface of the leadframe. The distance between the contact areas, or pitch, may be dependent on the minimum requirements of an electronic component the IC package will be mounted to, such as, for example, a PCB. In FIG. 1B, the leadframe 100 is partially etched on a top surface to create recesses 126 defining metal traces 122 thereon. In the embodiment shown, a metal plating has been added to bonding areas 118 disposed on a top surface of the metal traces 122 and to contact areas 106 disposed on a bottom surface of the metal traces 122. The metal plating of the bonding areas 118 and contact areas 106 may be formed by applying a bondable material or solderable to the metal traces 122, such as, for example, a plated or clad metal such as silver (Ag), gold (Au), copper (Cu), or other bondable materials. In various embodiments, the etching of the top surface of the leadframe 100 may be done at a first location, such as a manufacturing plant, and the remaining steps may be done at a second location, such as, for example, a different area of the manufacturing plant or a different manufacturing plant. In such embodiments, by partially etching the leadframe 100, the metal traces 122 are more stable and less likely to move than if the leadframe 100 were etched all the way through.

In FIG. 1C, an IC chip 104 has been secured to the leadframe 100 using an adhesive material 110, for example, an epoxy. After the IC chip is mounted to the leadframe 100, the IC chip may be electrically coupled to the bonding areas disposed outside of the die-attach area, for example, via wire bonds 114. In FIG. 1D, an encapsulation compound 108 (shown as shaded areas) has been applied to encapsulate the IC chip 104 and the wire bonds 114. In addition, the encapsulation compound 108 has also filled in the recesses 126, including those recesses 126 disposed under the IC chip 104. In FIG. 1E, a bottom surface of the leadframe 100 has been etched back. In various embodiments, the etching back of the bottom surface may include etching portions 108a of the leadframe 100 corresponding to the recesses that were formed in a top surface of the leadframe 100 to completely etch through the leadframe 100, thereby electrically isolating the metal traces 122 one from another such that the remaining portions of the leadframe 100 electrically couple the bonding areas 118 to the contact areas 106 via metal traces 122. In some embodiments, the etching back may include exposing a bottom surface of portions of the encapsulation compound 108. In various embodiments, the etching back may include etching portions 122a of some of the metal traces 122. As can be seen in the embodiment shown, the bonding areas 118 are laterally remotely disposed from the contact areas 106 such that no line perpendicular to the top surface of the leadframe 100 intersects both a bonding area and a contact area. In various embodiments, the metal traces 122 may be configured to provide an electrical pathway, or routing, from the bonding area 118 to the laterally remotely disposed contact area 106 disposed underneath the IC chip 104. In some embodiments, a protective coating 129 may be added to a portion of bottom surfaces of the metal traces 122. In some embodiments, the protective coating 129 may be added to various lower surfaces of the leadframe 100 and encapsulation compound 108.

Referring now to FIGS. 2A-B, various aspects of an embodiment of a partially etched leadframe 200 are shown. FIG. 2A is a top view of a partially etched leadframe 200 before an IC chip has been mounted thereon. FIG. 2B is a cross sectional side view of a portion of the leadframe 200 corresponding to Detail A of FIG. 2A. The leadframe 200 is shown having a plurality of recesses 226 (shown as unshaded portions) etched into a top surface thereof in a predetermined pattern to define upper portions of a plurality of metal traces 222 (shown as shaded portions). In the embodiment shown, each metal trace 222 has a bonding area 218 disposed at one end thereof and a contact area 206 disposed at an opposite end thereof. Although only the top surface has been etched in the embodiment show, for descriptive purposes, the locations of where the contact areas 206 will be disposed on a bottom surface of the leadframe 200 have been shown as unshaded squares. In FIG. 2B, the cross-sectional side view of Detail A of FIG. 2A shows the leadframe 200 after the recesses 226 have been etched into the top surface thereof to define upper portions of the metal traces 222.

Figure 3A:
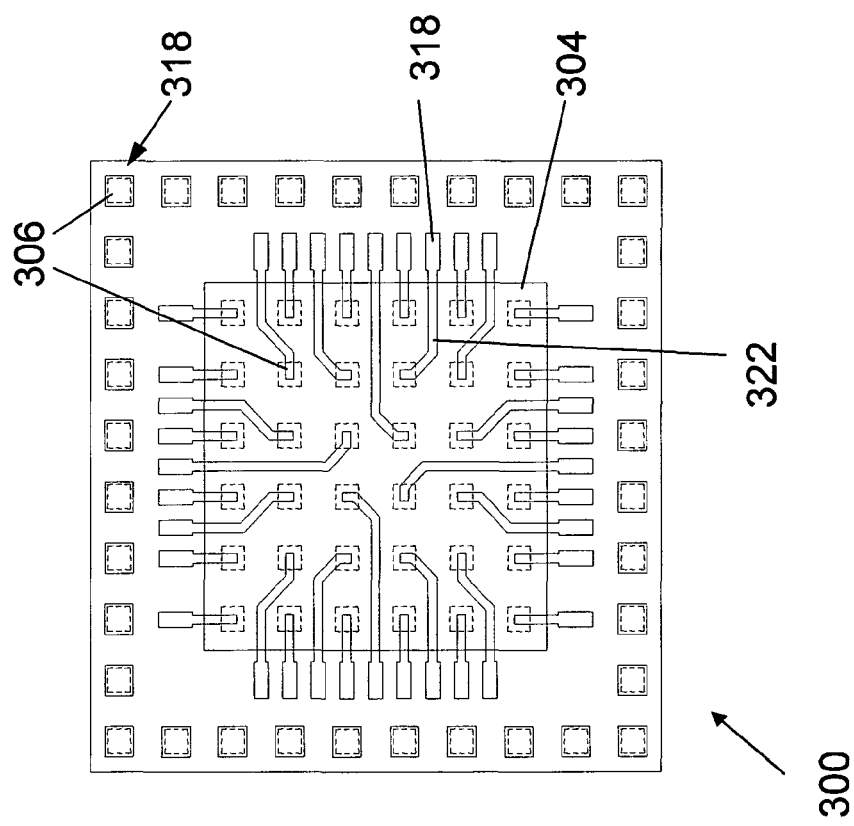

Referring now to FIGS. 3A-B, a top view and a bottom view of an embodiment of a partially etched leadframe 300 for use in an IC package manufacturing process are shown. In FIG. 3A, for descriptive purposes, an outline of an IC chip 304 is shown. In this embodiment, an outer row of bonding areas 318 (shown as solid-lined squares) are disposed directly over corresponding contact areas 306 (shown as dashed-lines squares). Additionally, an inner row of bonding areas 318 are shown laterally remotely disposed from corresponding contact areas 306 and electrically coupled thereto via metal traces 322.

Referring now to FIG. 3B, a bottom view of the leadframe 300 can be seen. In the embodiment shown, the location on the bottom surface of the leadframe 300 where the contact areas 306 may be disposed are shown as solid-lined squares. In some embodiments, metal plating may be applied to the contact areas 306 prior to etching. For descriptive purposes, the metal traces 322 have been shown as shaded portions. In some embodiments, the contact areas 306 are spaced apart at least a minimum distance from each other, such as, for example, the minimum distance required by PCB design specifications. In the embodiment shown, each bonding area 318 (shown as dashed-line squares) around the periphery of the leadframe 300 is disposed directly over a corresponding contact area 306 and therefore such bonding areas 318 must also be spaced apart at least the minimum distance from each other. However, because the metal traces 322 electrically couple the inner row of bonding areas 318 to laterally remotely disposed from corresponding contact areas 306, the bonding areas 318 may be separated by less than the minimum distance required by the PCB design specifications, while still allowing the contact areas 306 to be at least the minimum distance apart from each other.

Figure 4A:
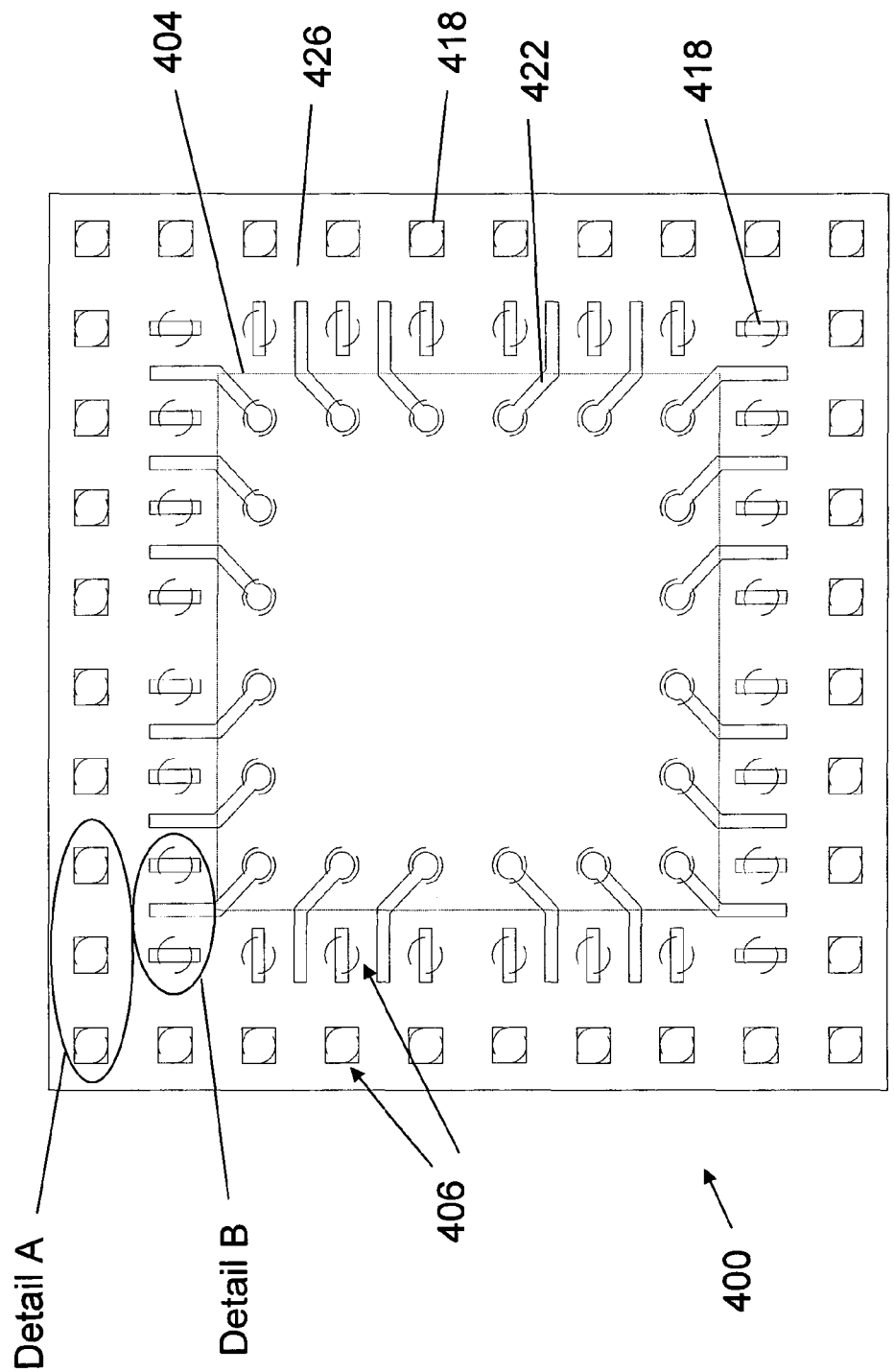

Referring now to FIG. 4A, a top view of an embodiment of a partially etched and selectively plated leadframe 400 is shown. For descriptive purposes, an outline of where an IC chip 404 may be mounted is shown as a dashed line. In this embodiment, recesses 426 have been formed by etching away portions of a top surface of the leadframe 400 to define upper portions of metal traces 422 having bonding areas 418 disposed thereon. In this embodiment, the locations of where the contact areas 406 are disposed on the bottom surface of the leadframe 400 are shown as broken circles. As will be described in more detail below, all of the outer row of bonding areas 418 are disposed directly over corresponding contact areas 406, while at least some of the inner row of bonding areas 418 are not disposed directly over corresponding contact areas 406, allowing the inner row of bonding areas 418 to be spaced closer together.

Referring now to FIG. 4B, top and side views are shown of Detail A and Detail B from FIG. 4A. In Detail A, recesses 426 have been etched into a top surface of leadframe 400 to define upper portions of metal traces 422 coupling bonding areas 418 on the top surface of the leadframe 400 to the locations where the contact areas 406 will be disposed on a bottom surface of the leadframe 400. Additionally, the top and bottom surfaces of the leadframe 400 have been selectively plated, for example, with a metal plating. As can be seen in the embodiment shown, the bonding areas 418 and the contact areas 406 have substantially the same width. Because the bonding areas 418 are disposed directly over the contact areas 406, the pitch of the bonding areas 418 must be equal to the pitch of the contact areas 406, which is dictated by the minimum requirements of the PCB to which the IC package will be mounted.

Referring now to Detail B, top and side views are provided showing a bonding area 418 interposed between two bonding areas 418 having contact areas 406 directly therebelow. In the embodiment shown, the bonding areas 418 are disposed on a top surface of the leadframe 400 and are shown as rectangles and the location of where the contact areas 406 will be disposed on a bottom surface of the leadframe 400 are shown as circles. In the embodiment shown in Detail B, the widths of the bonding areas 418 have decreased widths relative to the bonding areas shown in Detail A. Because one of the contact areas (not shown) is laterally remotely disposed from directly below the middle bonding area 418, the widths of all of the bonding areas 418 can be less than the widths of the contact areas 406, thus allowing the bonding areas 418 to be disposed closer together than the contact areas 406.

Figure 5:
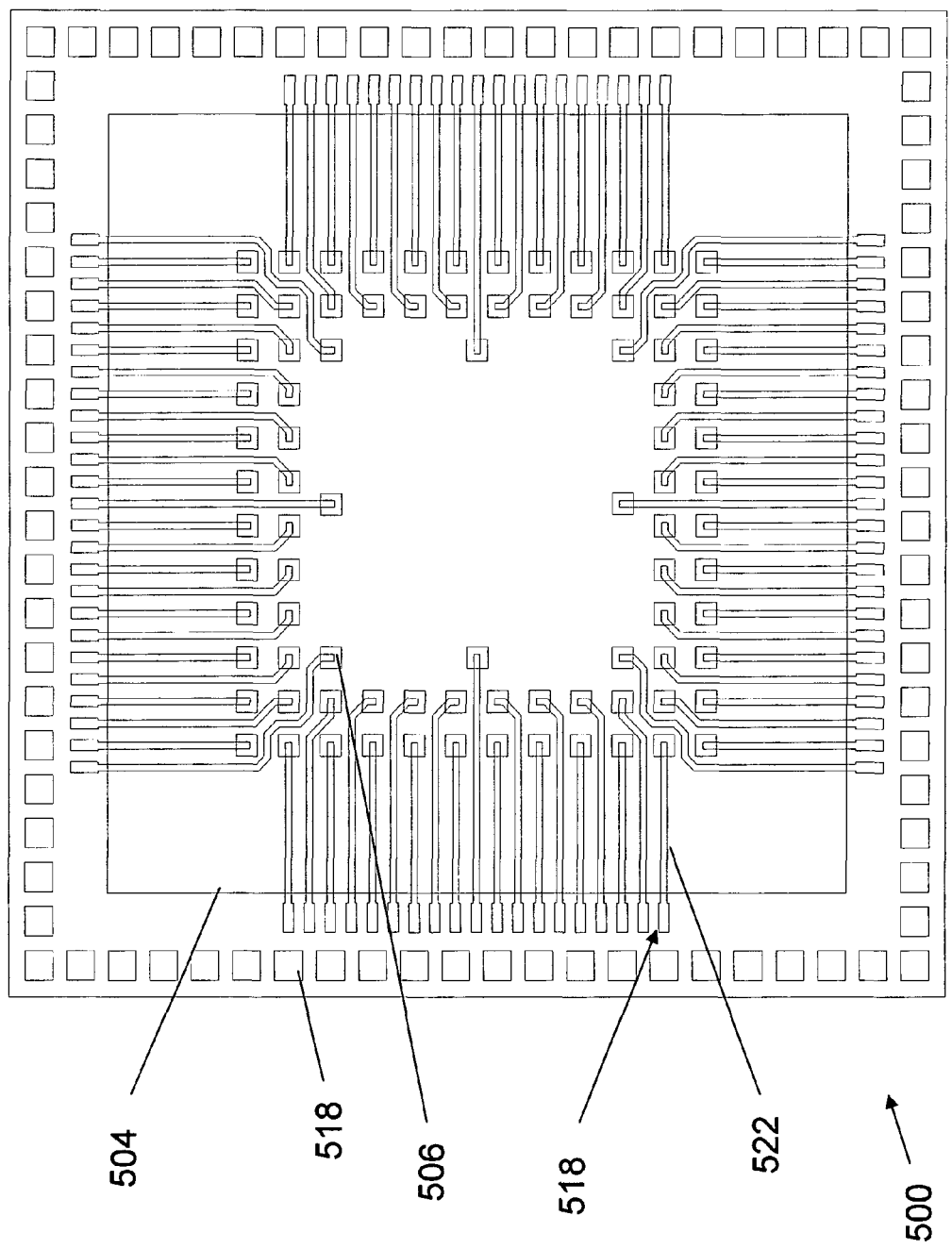
FIG. 5 shows an illustrative embodiment of a partially etched leadframe having a plurality of metal traces coupling bonding areas to contact areas.

Referring now to FIG. 5, a top view of an embodiment of a leadframe 500 having an outer row of bonding areas 518 around a perimeter of the leadframe 500 and an inner row of bonding areas 518 having contact areas 506 disposed below the area where an IC chip 504 will be mounted is shown. In this embodiment, the ends of the metal traces 522 where the inner row of bonding areas 518 are disposed have a width greater than the rest of the metal traces 522 coupling the bonding areas 518 to corresponding contact areas 506. For example, in various embodiments, the metal traces 522 may have a pitch on the order of 5.5 mils, with a width on the order of 1.5 mils and spaced on the order of 4 mils apart from each other. In various embodiments, the bonding areas 518 may have a pitch on the order of 5.5 mils, with a width on the order of 2.5 mils and spaced on the order of 3 mils apart from each other. In various embodiments, the minimum pitch of the contact areas 506 will be determined by the requirements of the PCB to which the IC package will be mounted. In various embodiments, the contact areas 506 may have a diameter of on the order of 6 mils and a pitch of 15.7 mils, a diameter of 7.9 mils and a pitch of 19.7 mils, or a diameter of 9.8 mils and a pitch of 25.6 mils.

Referring now to FIGS. 6A-6C, top views of various embodiments of a partially etched leadframe 600 are shown. In FIG. 6A, an embodiment of a leadframe 600 is shown having a die attach pad (DAP) 602 partially defined on a top surface thereof onto which at least a portion of an IC chip 604 may be mounted. In the embodiment shown, the area where the IC chip 604 will be mounted (the die-attach area) includes both the DAP 602 and portions of the metal traces 622. In various embodiments, the DAP 602 may provide, among other things, increased heat dissipation and/or structural support for the IC chip 604. In the embodiment shown in FIG. 6B, metal trace 622*a* is electrically coupled to the DAP 602, for example, to provide an electrical ground for the IC chip 604. In some embodiments, one or more channels may be formed in the DAP 602 to facilitate the flow of the encapsulation material into otherwise isolated or hard to reach places.

Referring now to FIG. 6C, a top view of a partially etched leadframe 600 that may be used in an IC package is shown. In the embodiment shown, the location of where an IC chip 604 may be mounted is shown. As can be seen, the IC chip 604 in this embodiment is smaller than the IC chips 604 of FIGS. 6A and 6B, showing that the utilization of metal traces allows at least a portion of the contact areas to be remotely disposed from corresponding bonding areas thereby increasing the number of I/O connections available for a given combination of sizes of IC chip and leadframe. As can be seen from the embodiment shown, using metal traces on the leadframe 600 to remotely dispose the contact areas from the bonding areas may be configured to provide a plurality of rows of bonding areas and a plurality of rows of contact areas. In various embodiments, three or more rows of bonding areas may be partially etched into the leadframe and metal plating corresponding to five or more contact areas may be disposed on a bottom surface of the leadframe. For example, a 5×5 mm leadframe may be configured to provide over 100 I/O connections. As can be seen in the embodiment shown, various embodiments may utilize a combination of routing outwardly and routing inwardly.

Figure 7:
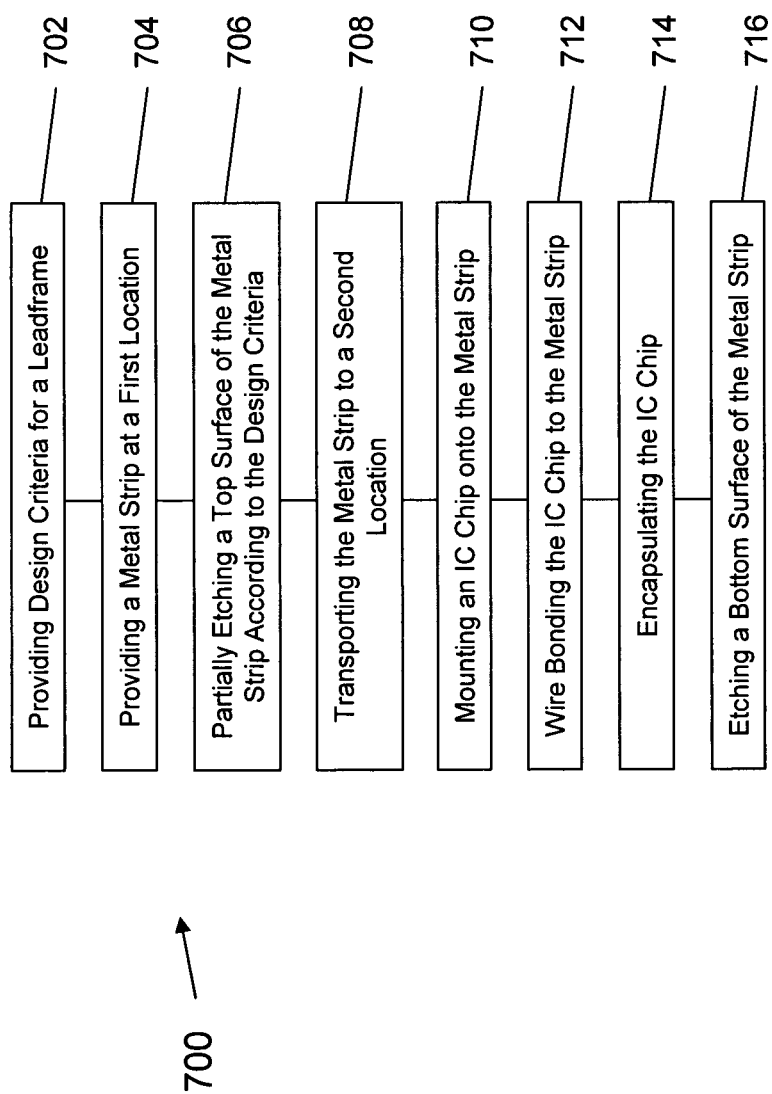
FIG. 7 is a flowchart of an embodiment of a process for manufacturing a partially etched leadframe.

Referring now to FIG. 7, a flow chart of an embodiment of an IC package manufacturing process 700 is shown. The process begins at step 702 when design criteria for a partially etched leadframe are provided to a manufacturer. In various embodiments, at least a portion of the design criteria may be received through a customer order and/or developed by the manufacturer. The design criteria may include information relative to a final IC package and/or may include only information relative to a partially etched leadframe. For example, the design criteria may include the length, width, and height of a desired leadframe, the size of the IC chip to be mounted onto the leadframe, the number of bonding areas, the location of the bonding areas, the number of contact areas, the location of the contact areas, and/or other design criteria. At step 704, a first location is provided with an unetched metal strip, such as, for example, a metal strip of copper. At step 706, the metal strip is partially etched on a top surface using any number of etching processes to create a pattern of recesses defining upper portions of metal traces having bonding areas disposed thereon. The pattern of recesses may correspond to the metal traces needed to couple the bonding areas to the locations of the contact areas as may be provided in the design criteria. In some embodiments, the etch may be a half-etch, such that the recesses formed in the leadframe extend halfway therethrough. For example, in a 4 mil leadframe, the half-etch would be a 2 mil etch. In various embodiments, the leadframe may be etched more or less than halfway therethrough. For example, in some embodiments, the partial etching may be to a depth on the order of 3 mils+/− 0.5 mils. After the top surface has been partially etched, one or both of the top and bottom surfaces of the leadframe may be selectively plated, such as, for example, by plating the bonding areas and/or the locations of where the contact areas will be disposed. The metal plating of the bonding areas may be formed by applying a bondable material to the metal traces. In various embodiments, a surface adhesion enhancement treatment ("AE treatment"), such as, for example, roughening and/or cleaning the surface to increase adhesion, may follow the metal plating.

At step 708, the partially etched leadframe may be transported from the first location to a second location. In various embodiments, the partially etched leadframe provides stability for the metal traces during transportation. For example, in some embodiments, the first location may be a portion of a manufacturing plant adapted for etching the top surface of the leadframe and the second location may be the same or a different portion of the manufacturing plant adapted to complete the IC packaging process. In some embodiments, the first location may be a first manufacturing plant and the second location may be a second manufacturing plant. In some embodiments, the first location may be a first manufacturing plant and the second location may be a customer's location or other location. At step 710, an IC chip is mounted onto the partially etched leadframe. Next, the IC chip is wire bonded to the partially etched leadframe at step 712 followed by encapsulation of the IC chip at step 714. The process ends with a back etching of a bottom surface of the metal strip at step 716.

Figure 8:
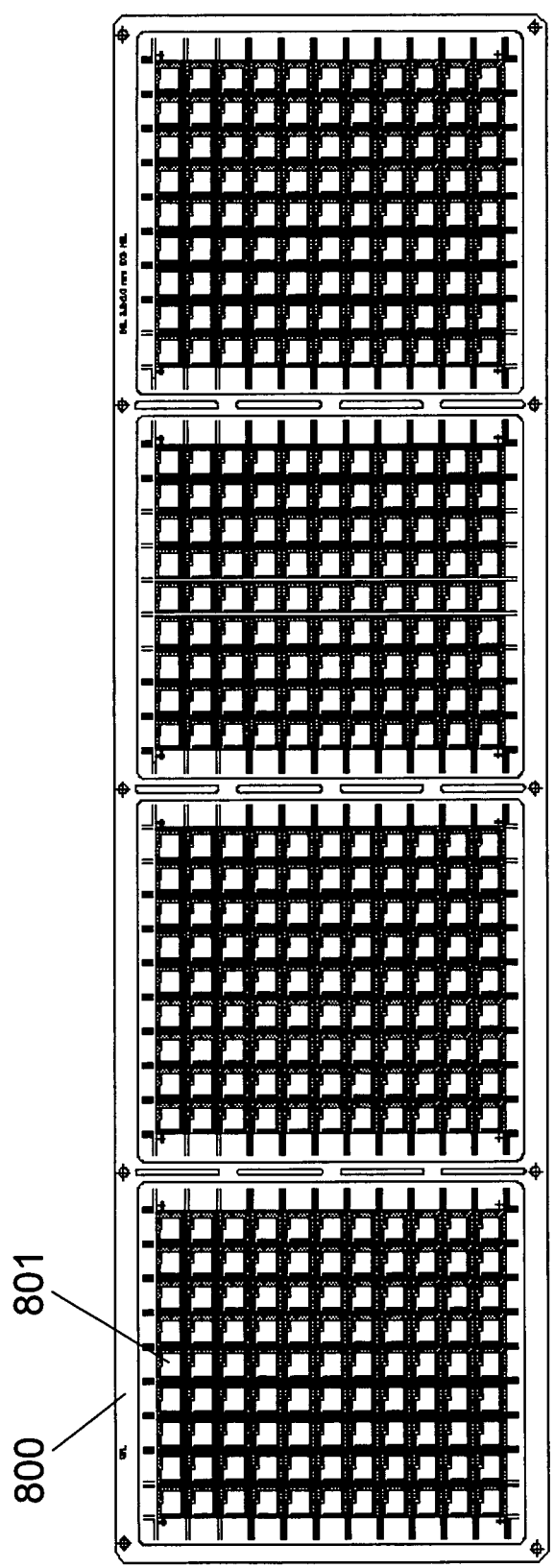
FIG. 8 illustrates an embodiment of a leadframe strip for use in forming a plurality of partially etched leadframes.

Referring now to FIG. 8, a metal strip 800, for example, of the type that may be used in an IC package manufacturing process, is shown. The metal strip 800 includes a plurality of device areas 801 disposed thereon. In some embodiments, the metal strip 800 may be copper or other metal or metal alloy and may have a thickness of 5 mils, more than 5 mils, or less than 5 mils. In various embodiments, the device areas 801 may vary in size and the number of device areas 801 on a metal strip 800 may also be varied. For example, in some embodiments, the number of device areas 801 on a metal strip 800 may be any number from less than 100 to more than 1000. During an IC manufacturing process, one or more IC chips may be attached to each device area 801 and encapsulated within an encapsulation compound. In various embodiments, the IC chips may be electrically coupled to the device area 801 via wire bonds or directly thereto in a flip-chip configuration. The IC manufacturing process may also include singulating the device areas 801 from each other to form a plurality of IC packages that may be configured to be mounted to an external device, such as a PCB. When the IC packages are mounted onto a PCB, the IC chips may be electrically coupled to the PCB via contact areas disposed on a bottom surface of the IC packages.

Although various embodiments of the method and system of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth herein.

What is claimed is:

1. A method of manufacturing a leadframe for an integrated circuit (IC) package, the method comprising:
   receiving design criteria for a partially patterned leadframe for use in an IC package, the design criteria including a first number of bonding areas to be disposed on a top surface of the leadframe and a second number of contact areas to be disposed on a bottom surface of the leadframe;
   providing at a first location a metal strip having a top surface and a generally flat bottom surface;
   etching at the first location the top surface of the metal strip to define a plurality of bonding areas equal to the number of bonding areas from the design criteria and to define upper portions of a plurality of metal traces, each metal trace extending from the top surface to the bottom surface of the metal strip and coupling a bonding area of the plurality of bonding areas to an area disposed on the bottom surface of the metal strip where a contact area will be defined;
   wherein at least one metal trace couples a bonding area of the plurality of bonding areas to a contact area laterally remotely disposed from beneath the bonding area;
   transporting the metal strip from the first location to a second location prior to an IC chip being mounted thereto, the first location being a first manufacturing facility and the second location being a second manufacturing facility remotely disposed from the first manufacturing facility; and
   wherein the generally flat bottom surface provides support for the metal traces integrally formed therewith during the transporting of the metal strip.

2. The method of claim 1, wherein the second location is a location of a customer sending the design criteria.

3. The method of claim 1 comprising mounting, at the second location, an IC chip to the top surface of the metal strip.

4. The method of claim 3, wherein the IC chip is mounted to at least one metal trace, the at least one metal trace coupling a contact area disposed beneath the IC chip to a bonding area disposed peripherally to the IC chip.

5. A method of manufacturing a leadframe for an integrated circuit (IC) package, the method comprising:
   receiving design criteria for a partially patterned leadframe for use in an IC package, the design criteria including a first pattern of locations of a plurality of bonding areas to be disposed on a top surface of the leadframe and a second pattern of locations of a plurality of contact areas to be disposed on a bottom surface of the leadframe;
   providing, at a first location, a metal strip having a top surface and a generally flat bottom surface;
   etching, at the first location, the top surface of the metal strip to define the plurality of bonding areas at the locations of the first pattern and to define upper portions of a plurality of metal traces, the plurality of metal traces coupling the locations of the first pattern of the plurality of bonding areas on the top surface of the metal strip to the locations of the second pattern of the plurality of contact areas on the bottom surface of the metal strip;
   applying a metal plating to the locations of the first pattern of the plurality of bonding areas and to the locations of the second pattern of the plurality of contact areas on the bottom surface of the metal strip;
   transporting the etched metal strip to a second location, the first location being a first manufacturing facility and the second location being a second manufacturing facility remotely disposed from the first manufacturing facility; and
   wherein at least one of the plurality of metal traces electrically couples a bonding area laterally disposed from a contact area such that no line perpendicular to the top surface of the metal strip intersects both the bonding area and the contact area electrically coupled thereto via the metal trace.

6. The method of claim 5 comprising:
   cleaning the etched metal strip at the first location; and
   preparing the etched metal strip for transport to a the second location.

7. The method of claim 6, wherein the receiving the design criteria is in conjunction with a customer order.

8. The method of claim 5 comprising mounting, at the second location an IC chip to the top surface of the metal strip.

9. The method of claim 5 comprising transporting the etched metal strip to a location of a customer sending the design criteria of the IC package to the first location.

10. A method of manufacturing a leadframe for an integrated circuit (IC) package, the method comprising:
    performing a first leadframe manufacturing process at a first location, the first manufacturing process comprising:
       providing a metal strip having a top surface and a generally flat bottom surface;
       etching a pattern into the top surface of the metal strip defining upper portions of a plurality of metal traces, each metal trace extending from the top surface to the bottom surface of the metal strip and having a bonding area disposed on the top surface thereof and a contact area disposed on the bottom surface thereof; and
       applying a metal plating to each bonding area to form a leadframe subassembly adapted for transport;
    transporting the leadframe subassembly from the first location to a second location, the first location being a first manufacturing facility and the second location being a second manufacturing facility remotely disposed from the first manufacturing facility;
    performing a second manufacturing process at the second location, the second manufacturing process comprising:
       mounting an IC chip onto the top surface of the metal strip;
       electrically coupling the IC chip to the plurality of bonding areas; and
       encapsulating the IC chip in an encapsulation compound; and
    etching the bottom surface of the leadframe to electrically isolate the metal traces from one another such that at least one of the plurality of metal traces electrically couples a bonding area laterally disposed from a contact area wherein no line perpendicular to the top surface of the metal strip intersects both the bonding area and the contact area electrically coupled thereto via the metal trace.

11. The method of claim 10, wherein the first manufacturing process is performed in at least partial dependence on design criteria of the IC package.

12. A method of manufacturing a leadframe for an integrated circuit (IC) package, the method comprising:
    providing, at a first location, a metal strip having a top surface and a generally flat bottom surface;
    etching, at the first location, a pattern into the top surface of the metal strip defining upper portions of a plurality of metal traces, each metal trace extending from the top surface to the bottom surface of the metal strip and having a bonding area disposed on the top surface thereof and a contact area disposed on the bottom surface thereof;

applying a pattern of metal plating to top surface and the bottom surface, the pattern of metal plating covering each bonding area and each contact area;

facilitating transporting the etched metal strip to a second location, the first location being a first manufacturing facility and the second location being a second manufacturing facility remotely disposed from the first manufacturing facility;

wherein, when remaining portions of the metal strip disposed between the plurality of metal traces are etched away, the plurality of metal traces are electrically isolated from one another; and wherein at least one of the plurality of metal traces electrically couples a bonding area laterally disposed from a contact area such that no line perpendicular to the top surface of the metal strip intersects both the bonding area and the contact area electrically coupled to the bonding area via the metal trace.

13. The method of claim 12 comprising:

transporting the etched metal strip to a location of a customer sending design criteria of the IC package to the first location.

14. The method of claim 12, wherein the pattern is etched into the top surface of the metal strip in at least partial dependence on design criteria of the IC package.

* * * * *